United States Patent [19]

Redwine et al.

[11] Patent Number: 5,349,225
[45] Date of Patent: Sep. 20, 1994

[54] FIELD EFFECT TRANSISTOR WITH A LIGHTLY DOPED DRAIN

[75] Inventors: Donald J. Redwine, Houston; Mousumi Bhat, Austin; Michael Smayling, Missouri City, all of Tex.

[73] Assignee: Texas Instruments Incorporated, Dallas, Tex.

[21] Appl. No.: 46,571

[22] Filed: Apr. 12, 1993

[51] Int. Cl.$^5$ .................. H01L 29/06; H01L 21/268
[52] U.S. Cl. .................. 257/336; 257/344; 257/345; 257/408; 437/27; 437/40; 437/44; 437/48; 437/913
[58] Field of Search .............. 257/336, 344, 345, 408; 437/27, 40, 44, 48, 913

[56] References Cited

U.S. PATENT DOCUMENTS

| | | | |
|---|---|---|---|
| 4,376,947 | 3/1983 | Chiu et al. | 357/23 |
| 5,021,353 | 6/1991 | Lowrey et al. | 257/408 |
| 5,026,657 | 6/1991 | Lee et al. | 257/408 |
| 5,079,611 | 1/1992 | Ikeda et al. | 257/408 |
| 5,202,576 | 4/1993 | Liu et al. | 257/315 |
| 5,264,384 | 11/1993 | Kaya et al. | 437/43 |

FOREIGN PATENT DOCUMENTS

| | | |
|---|---|---|
| 0197501 | 3/1981 | European Pat. Off. |
| 0360504 | 3/1990 | European Pat. Off. |
| 60-247974 | 12/1985 | Japan |
| 0273728 | 7/1988 | Japan |

*Primary Examiner*—Edward Wojciechowicz
*Attorney, Agent, or Firm*—Ira S. Matsil; James C. Kesterson; Richard L. Donaldson

[57] ABSTRACT

A transistor device 10 formed in a semiconductor layer 12 is disclosed herein. A first source/drain region 14 is formed in the semiconductor layer 12. A second source/drain region 16 is also formed in the semiconductor layer 12 and is spaced from the first source/drain region 14 by a channel region 18. The second source/drain region 16 includes (1) a lightly doped portion 16b adjacent the channel region 18 and abutting the top surface, (2) a main portion 16a abutting the top surface and spaced from the channel region 18 by the lightly doped portion 16b, and (3) a deep portion 16c formed within the layer 12 and spaced from the top surface by the lightly doped portion 16b and the main portion 16a. A gate electrode 20 is formed over at least a portion of the channel region 18 and insulated therefrom.

35 Claims, 6 Drawing Sheets

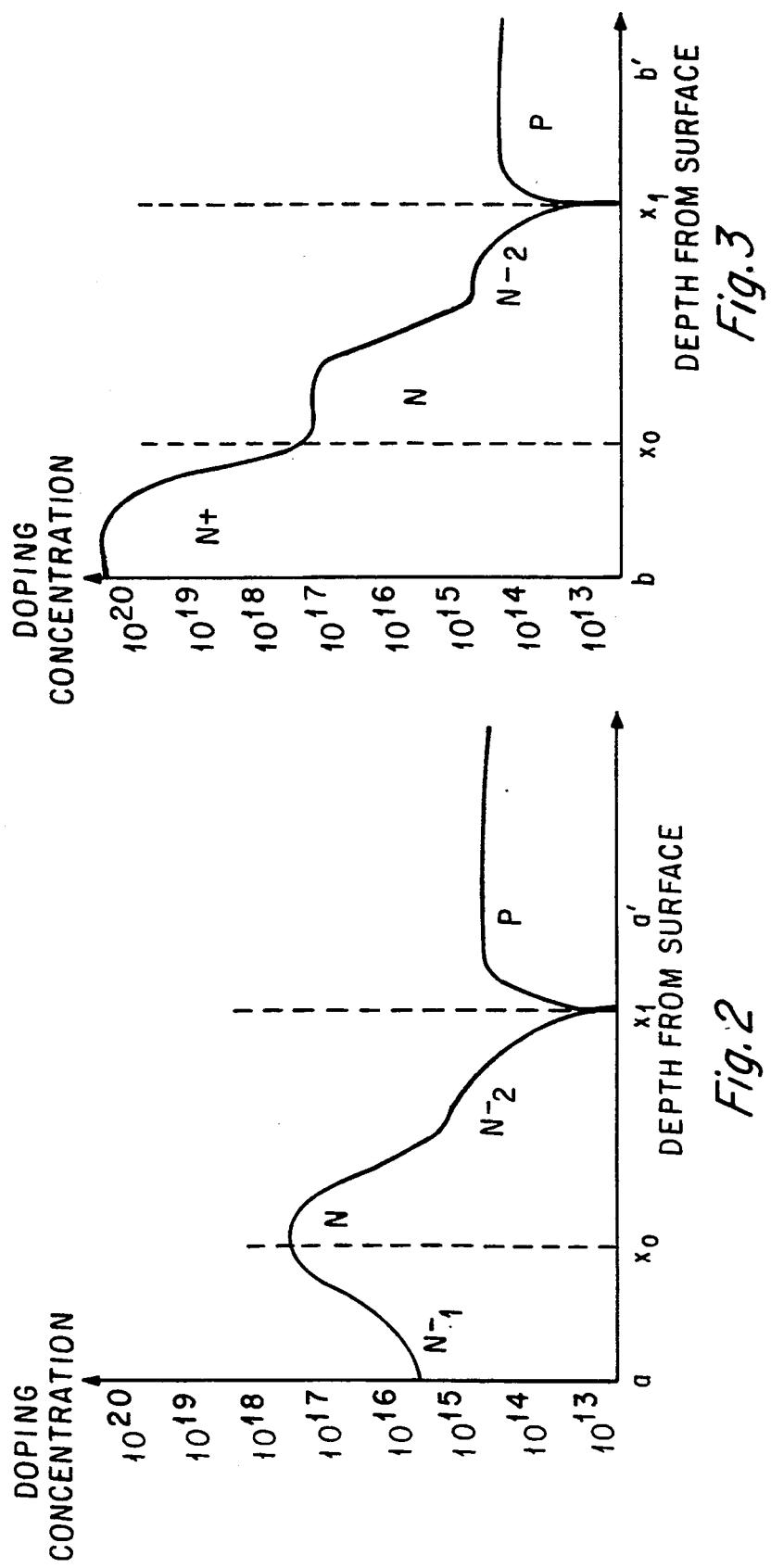

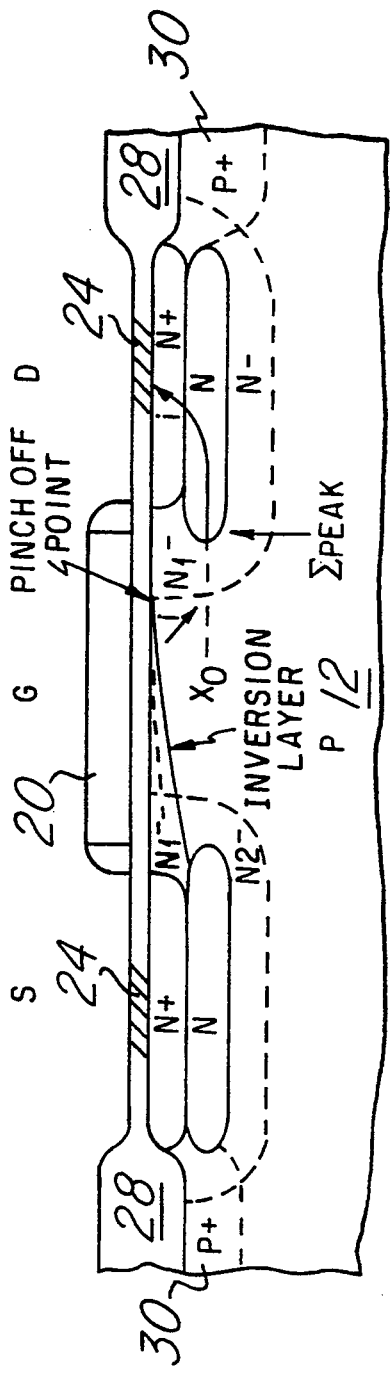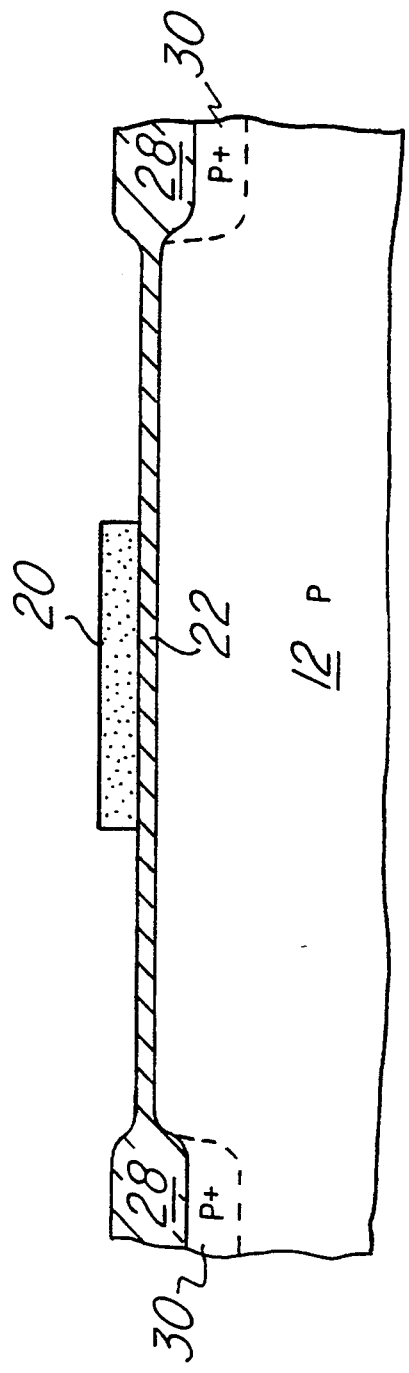

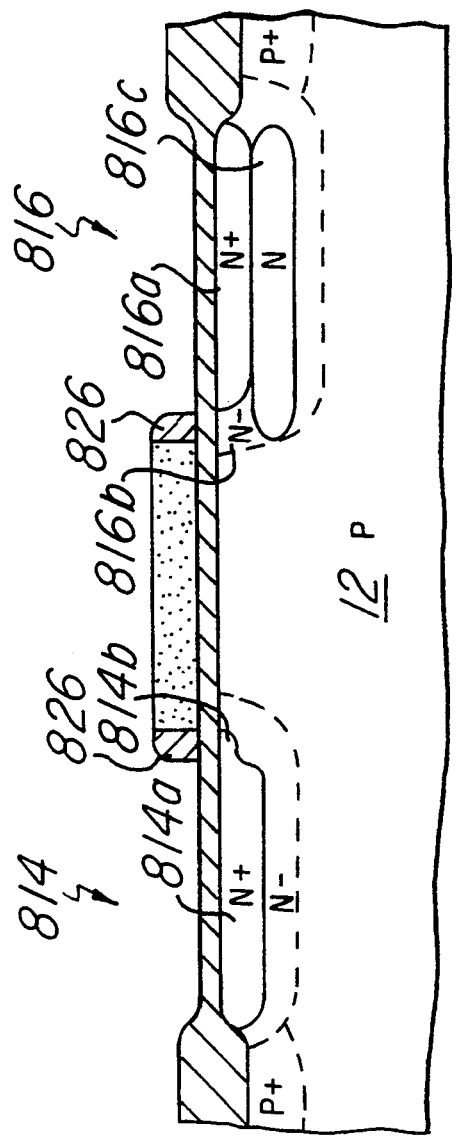
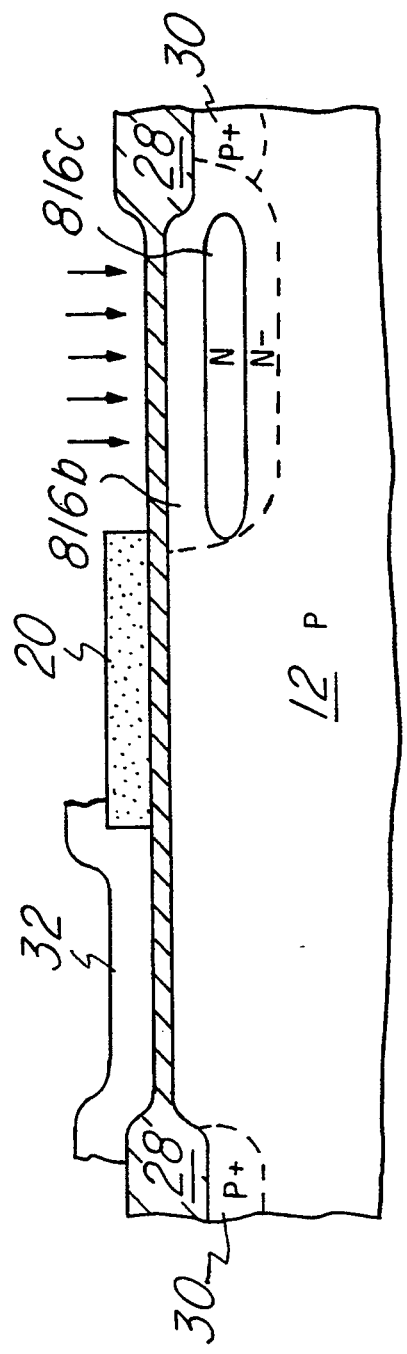

FIELD EFFECT TRANSISTOR WITH A LIGHTLY DOPED DRAIN

FIELD OF THE INVENTION

This invention generally relates to the fabrication of semiconductor devices and specifically to a transistor device with a lightly doped drain and a method for forming the transistor device.

BACKGROUND OF THE INVENTION

The difficulty in the fabrication of small geometry high-performance metal oxide semiconductor field-effect transistors (MOSFETS) is the following quandary: if the source/drain junctions are doped to a level high enough to give reasonably low series resistance, the magnitude of the electric field in the channel adjacent the drain during the on state will be so high that hot carriers and impact ionization effects will become a nuisance and result in lifetime degradation.

As the MOSFET channel becomes shorter, the electric field along the channel becomes stronger (for a given power supply voltage). That is, the potential distribution becomes two dimensional, and the effect of the electric field along the channel can no longer be ignored while considering the effects of the electric field normal to the channel. In particular, where the electric field along the channel high, as is likely to be in short channel MOS devices, impact ionization is likely to occur near the drain. The resulting substrate current greatly increases the likelihood of device latchup in CMOS technologies. In addition, hot carriers are also likely to be generated by the strong electric field magnitude near the drain, and some of these carriers may be injected into the gate oxide, leading to threshold voltage shift and transconductance degradation.

One approach to minimize the degradation is to reduce the electric field at the drain region to prevent the carders from achieving sufficient energy to be injected into the gate oxide. This is achieved by grading the junction of the drain by doing two implants into the source/drain region. One of the implants is designed to create a lighter doped region beyond the normal N+ drain region. This can be done by offsetting the heavier implant with a sidewall spacer foxing the drain structure, sometimes called a lightly doped drain (LDD). Another approach is simply to do two implants of phosphorus and arsenic in the same region to form a structure which is sometimes called a double doped (or double diffused) drain (DDD). The electric field in the drain region is reduced for both these structures due to the graded drain doping.

SUMMARY OF THE INVENTION

The prior art methods provide several disadvantages. In both of the methods described, the peak electric field occurs near the substrate surface, at the drain end of the device. Since the atomic bonds are weakest at the silicon-silicon dioxide interface, i.e., compared to the silicon crystal, hot electron-stress damage readily occurs in these LDD (lightly doped drain) structures.

In addition, all current flow must pass through the lightly doped and therefore highly resistive regions. This property of the prior art methods has a detrimental effect on the device characteristics.

The present invention provides a structure and method for an improved transistor device which provides advantages over prior art devices.

In a first embodiment, a transistor device is formed in a semiconducter layer. A first source/drain region is formed in the semiconductor layer. A second source/drain region is also formed in the semiconductor layer and is spaced from the first source/drain region by a channel region. The second source/drain region includes (1) a lightly doped portion adjacent the channel region and abutting the top surface, (2) a main portion abutting the top surface and spaced from the channel region by the lightly doped portion, and (3) a deep portion formed within the layer and spaced from the top surface by the lightly doped portion and the main portion. A gate electrode is formed over at least a portion of the channel region and insulated therefrom.

In one embodiment, the first source/drain region also includes (1) a lightly doped portion adjacent the channel region and abutting the top surface, (2) a main portion abutting the top surface and spaced from the channel region by the lightly doped portion, and (3) a deep portion formed within the layer and spaced from the top surface by the lightly doped portion and the main portion. In another embodiment, the first source/drain region includes only the main portion.

A method of forming a transistor including a lightly doped drain is also described herein. A semiconductor layer including a top surface is provided. A gate dielectric layer is formed over a portion of the top surface. A gate electrode is then formed over at least a portion of the gate dielectric layer. Dopants are implanted to form a deep source/drain region in the semiconductor layer. The deep source/drain region is aligned to an edge of the gate electrode. A first sidewall insulating region. is then formed adjacent the gate electrode. Main source/drain regions are then formed in the semiconductor layer abutting the top surface and aligned to the sidewall insulating regions.

The transistor device provides advantages over prior devices as will be described herein.

BRIEF DESCRIPTION OF THE DRAWINGS

The above features of the present invention will be more clearly understood from consideration of the following descriptions in connection with accompanying drawings in which:

FIGS. 2 and 3 are graphical illustrations of the doping profile into the substrate of the device of FIG. 1;

FIG. 4 provides an illustration of the current flow and peak electric field of a transistor device during operation;

FIGS. 5 through 7 provide cross-sectional views at various stages of a preferred embodiment fabrication flow;

FIG. 8 provides a cross-sectional view of an alternative asymmetric embodiment transistor structure; and FIGS. 9 and 10 illustrate cross-sectional views of alternate fabrication steps used in forming the embodiment of FIG. 8.

Corresponding numerals and symbols in the different figures refer to corresponding parts unless otherwise indicated.

DETAILED DESCRIPTION OF PREFERRED EMBODIMENTS

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not limit the scope of the invention.

The following is a description of the present invention. The invention will first be described with reference to one exemplary structure. Some variations will then be described as well as advantages of the present invention. A preferred method of fabrication will then be discussed. An alternate, asymmetric embodiment will then be described along with the variations in the process flow to fabricate this embodiment.

Figure 1:
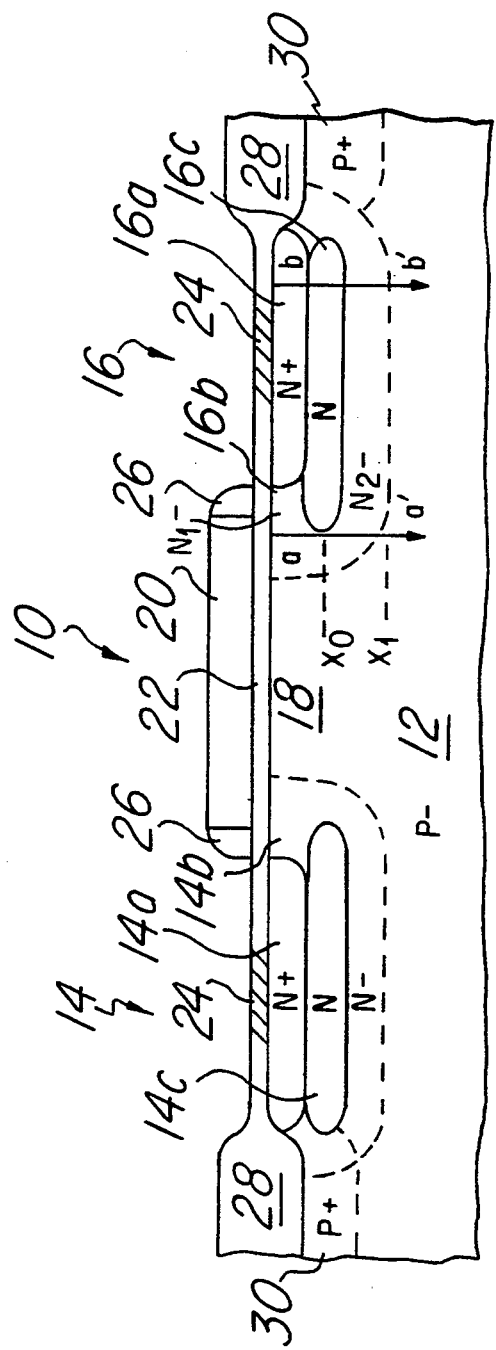
FIG. 1 is a cross-sectional view of a preferred embodiment transistor structure.

The structure illustrated in FIG. 1 provides a possible solution to the problems found in prior devices. In a preferred embodiment of forming this transistor device, a high energy implant places dopants at a deeper level, prior to the formation of sidewall oxide regions. This implant step causes a retrograde doping profile, in the vertical direction back toward the surface of the silicon. After sidewall oxide another implant with a higher concentration is implanted to complete the structure. An additional implant of opposite type may be implanted at a lower energy after, possibly immediately after, the first implant to adjust or control the amount of retrograde in the first doping profile.

A cross-sectional view of a preferred embodiment structure is illustrated in FIG. 1. A transistor device 10 is fabricated on a semiconductor substrate 12. The semiconductor substrate 12 preferably comprises silicon but other semiconductors such as germanium or gallium arsenide may also be used. As illustrated in FIG. 1, the transistor device 10 may be fabricated directly in the semiconductor substrate. Alternatively, the device 10 may be fabricated in a structure on the substrate. As examples, the layer 12 may comprise an expitaxial layer formed on a substrate, a well (or tub or tank) formed within a substrate, a semiconductor on insulator (SOI) or a combination of these. Therefore, the substrate 12 will be referred to more generally as a semiconductor layer 12.

Source region 14 and drain region 16 are formed in the semiconductor layer 12. Of course, in operation the functions of the regions may be reversed. The drain region 16 includes a main drain region 16a, a lightly doped drain region 16b and a deep drain region 16c. Further details of these regions will be discussed below. Likewise, the source regions includes a main source region 14a, a lightly doped region 14b and a deep source region 14c. In some embodiments, it may also be desirable to have an asymmetric structure (as shown in FIG. 8). That is, the source region 14 (which is labeled as 814 in FIGS. 8-10) may include only the main source region 14a (or 814a in FIG. 8) and lightly doped region 14b (or 814b in FIG. 8) but not region 14c (or 814c in FIG. 8). This asymmetric embodiment will be discussed in more detail below along with FIGS. 8-10.

The lines dram in the figure to separate the various portions of the source/drain regions should be thought of as contour lines. For example, the line separating regions 14b and 14c may denote the point where the doping concentration is $10^{17}$ cm$^{-3}$. The dotted line surrounding the source/drain regions is presented to show the junction between the n-doped and p-doped semiconductor regions.

Although illustrated as an n-channel (or NMOS) device, the present invention may also be used with p-channel devices. Preferred n-type dopants include arsenic and phosphorus but other dopants such as antimony can be used. For p-channel devices, the preferred source/drain dopants is boron but other dopants such as aluminum and gallium may also be used.

The source 14 and drain 16 are separated by a channel region 18. Overlying at least a portion of the channel region is a gate electrode 20. The gate electrode preferably comprises doped polysilicon (polycrystalline or amorphus) but may include other conductive materials such as a metal. Aluminum is one example.

The gate 20 is insulated from the channel region by a gate dielectric 22. The gate dielectric 22 may comprise an oxide such as silicon dioxide or a nitride such as silicon nitride. The gate dielectric 22 may also comprise a stack of different materials, for example nitride-oxide (NO) or oxide-nitride-oxide (ONO). As illustrated in FIG. 1, the gate dielectric may also extend over the source 14 and drain 16. If so, contacts 24 may be formed in the dielectric 22 to electrically connect the source 14 and drain 16 to other components in the circuit.

Sidewall insulating regions 26 may be formed adjacent to the gate electrode 20. In a preferred embodiment, the sidewall regions 26 comprise an oxide such as silicon dioxide. Nitride sidewalls 26 may also be used.

Field insulating regions 28 and channel stops 30 are included to isolate the transistor 10 from other devices (possibly including other identical transistors) formed on the same chip. The field insulating region 28 preferably comprises a field oxide region such as thermally grown silicon dioxide. The channel stop 30 comprises a relatively highly doped region of opposite conductivity type as the source/drain regions. Although illustrated with both field oxides and channel stops, other isolation methods such as trenches may be used without affecting the inventive concepts of the present invention. In other words, the method of isolation is not critical to the invention.

Doping profiles along the lines a—a' and b—b' of FIG. 1 are illustrated in FIGS. 2 and 3 respectively. These figures graphically illustrate the doping concentration as a function of distance into the crystal surface within the source/drain regions. The specific doping concentrations illustrated in the figures provide an example of a possible embodiment. The depth $x_0$ is the depth of the peak doping concentration of the deep source/drain portion 16c (or 14c). The depth $x_0$ may be between about 0.2 and 0.6 microns and preferably about 0.4 microns for one micron technologies. The depth $x_0$ will become shallower as the channel length gets shorter. The depth $x_0$ is the depth of the p-n junction between the source/drain region and the semiconductor layer 12.

The vertical doping profile of the portion of the source/drain region nearest to the gate 20 includes a retrograde region where the region is relatively lightly doped. Continuing into the semiconductor layer 12 the doping concentration becomes higher and then lower again. The p-doped region represents the original doping of the layer 12. On the other hand, portions of the source/drain region farther from the gate (and possibly extending all the way to a field insulating region 28) are relatively highly doped at the surface and become less highly doped as the distance from the surface increases.

The structure of the present invention provides several advantages. First, if the transistor is conducting current in the linear region, then the conduction is along the surface and is handled by the lightly doped region 16b at the drain end and just under the gate 20. If, on the other hand, the transistor is conducting current in the saturation region, then the current flow goes deeper into the bulk and is picked up by the peak doping at depth $x_0$. Thus, the higher current level is handled by the lowest resistance region of the drain. The operation of the device is illustrated in FIG. 4, which illustrates the current flow i through the transistor.

Under high current conditions (in the saturation region) the current flow would cross the peak electric field ($\epsilon_{peak}$ in FIG. 4) in the semiconductor crystal and not at the surface where the weak $Si/SiO_2$ atomic bonds are located. Thus, the hot electron stress tolerance should be much improved.

A preferred method of fabricating the structure of the present invention is described with reference to FIGS. 5 through 7. Referring first to FIG. 5, a semiconductor layer 12 is provided. As previously discussed, the layer 12 may comprise a substrate or a layer within a substrate.

Field insulator regions 28 and channel stop regions 30 are formed using known techniques. For example, the channel stops may be formed by implanting a dopant such as boron. Field isolation may comprise field oxide regions formed by a known LOCOS (local oxidation of silicon process).

A gate dielectric layer 22 is then formed. For example, the gate dielectric layer 22 may comprise a thermally grown oxide. Alternatively, the dielectric may be deposited for example by chemical vapor deposition.

In the preferred embodiment process flow, the gate 20 is formed next. The gate 20 may be formed by blanket deposition of polysilicon followed by a patterned etch. The polysilicon may be in situ doped or doped after deposition.

Figure 6:
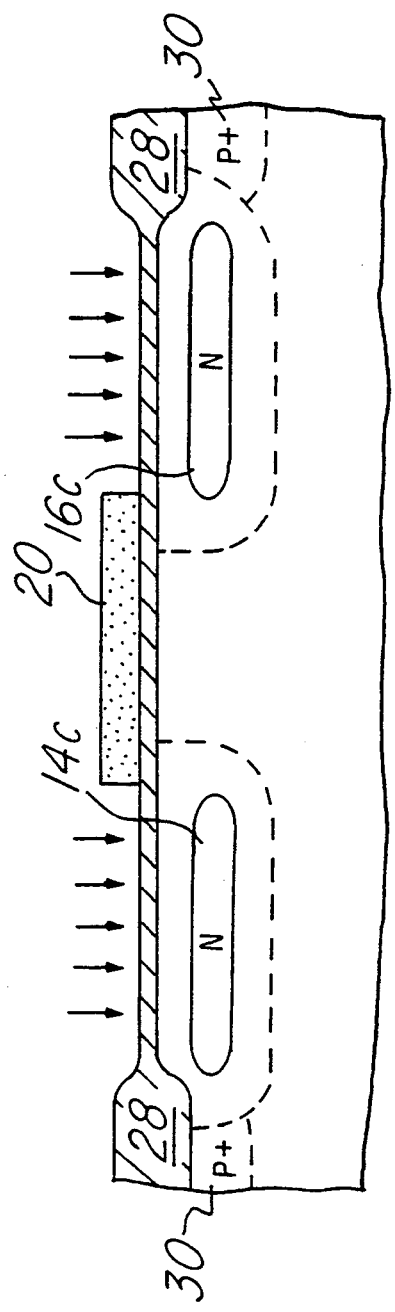

Referring now to FIG. 6, the deep source/drain regions 14c and 16c are formed. In the preferred embodiment, dopants are implanted to form a peak concentration at the desired distance from the layer 12 surface. For a channel length of about one micron, the peak doping concentration is preferably about 0.4 microns beneath the surface. The implantation energy is typically between about 100 keV and 200 keV and preferably about 150 keV.

An additional implant of opposite conductivity type (e.g., p-type for the example illustrated) may be performed at a lower energy level to adjust or control the amount of retrograde in the doping profile (see FIG. 2).

Figure 7:
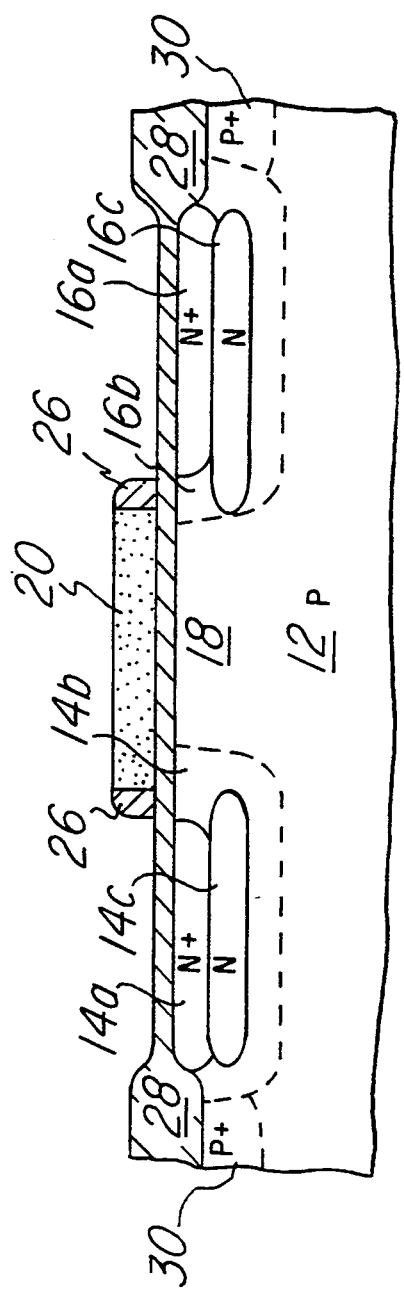

Referring next to FIG. 7, sidewall insulating regions 26 are formed on the sidewalls of gate 20. The sidewalls 26 preferably comprise silicon dioxide but may also comprise a nitride. In one embodiment, a conformal layer of oxide is deposited over the entire structure followed by an anisotropic etch which forms the sidewall oxide regions 26.

The main source/drain regions 14a and 16a are next formed preferably by ion implantation. The doping concentration of this implantation step will be heavier than the previous step and will have a peak concentration near the surface. The doping profiles were previously discussed with reference to FIGS. 2 and 3. The dopant used for the main source/drain implant may be the same as the dopant used for the deep source/drain implant but does not necessarily need to be the same. For example, arsenic can be used for one implant while phosphorus is used for the other.

As previously mentioned, it may be desirable to create the deep source/drain structure on only one side of the transistor device. In other words, an asymmetric device may be desired. An example of an asymmetric device is shown in FIG. 8. In this example, the source region 814 comprises only main source region 814a and lightly doped source region 814b while the drain region 816 includes main region 816a, lightly doped drain 816b and deep drain region 816c as previously discussed.

Figure 10:
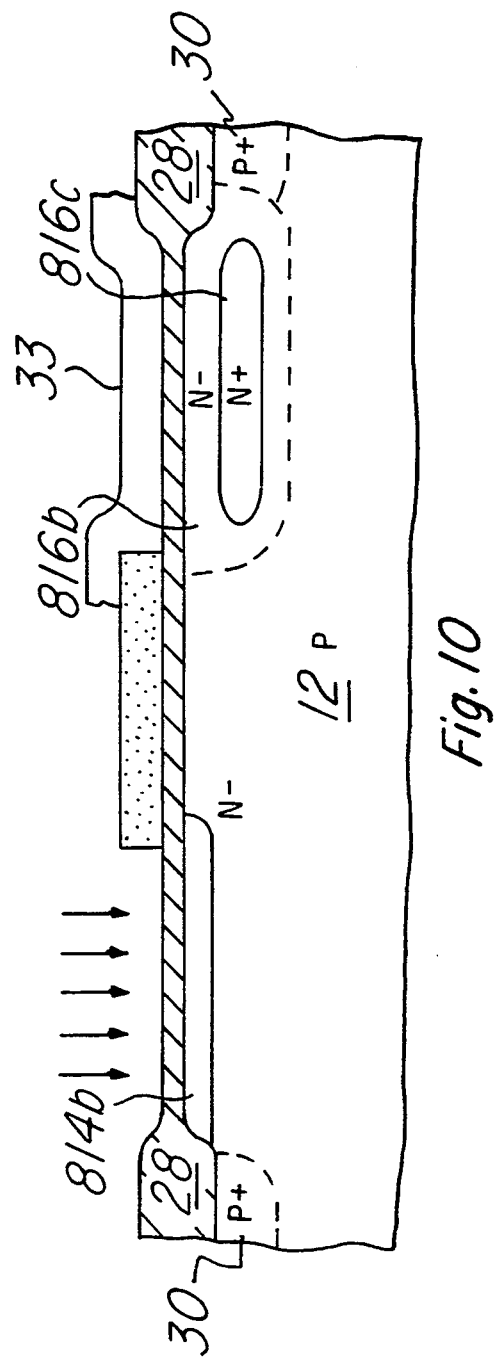

FIGS. 9 and 10 illustrate two variations in the process flow which may be used to form this asymmetric structure. Referring first to FIG. 9, a mask 32 is formed over the source regions prior to the first implantation step (i.e., the step illustrated in FIG. 6). For example, this mask structure 32 would extend from the gate 20 to the field oxide 28 on the source side of the structure. After the deep drain region 816c is implanted, the mask 32 is removed.

Referring next to FIG. 10, a second mask structure 33 is formed over the drain regions. The lightly doped portion of the source region 814b is then formed in the exposed portion. In the preferred embodiment, a light implant is performed to generate the source region 814b. After the source region 814b is formed, the mask 33 is removed. It should also be noted that the steps illustrated in FIGS. 9 and 10 can be reversed. In other words, the source region 814b can be formed prior to the drain regions 816b and 816c.

Sidewall spacers 826 are then added and source/drain regions 814a and 816a are implanted simultaneously. The resulting structure is illustrated in FIG. 8.

Other steps may be performed which are not illustrated here. For example, contacts are made to the source, drain and gate and interconnects formed to connect this device to other devices on the chip. A protective overcoat layer may also be used.

The transistor of the present invention may be used in applications such as microprocessors and memories.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A transistor device comprising:
   a semiconductor layer, including a top surface;
   a first source/drain region of a first conductivity type formed in said semiconductor layer;
   a second source/drain region of said first conductivity type formed in said semiconductor layer spaced from said first source/drain region by a channel region, said second source/drain region comprising:
   a lightly doped portion of said first conductivity type adjacent said channel region and abutting said top surface, said lightly doped portion having a first doping concentration;
   a main portion of said first conductivity type abutting said top surface and spaced from said channel region by said lightly doped portion said main portion having a second doping concentration which is greater than said first doping concentration;

a deep portion of said first conductivity type formed within said layer and spaced from said top surface by said lightly doped portion and said main portion said deep portion having a third doping concentration which is greater than said first doping concentration but less than said second doping concentration; and a gate electrode formed over at least a portion of said channel region and insulated therefrom.

2. The device of claim 1 wherein said first source/drain region comprises:

a lightly doped portion of said first conductivity type adjacent said channel region and abutting said top surface, said lightly doped portion having a first doping concentration;

a main portion of said first conductivity type abutting said top surface and spaced from said channel region by said lightly doped portion said main portion having a second doping concentration which is greater than said first doping concentration; and a deep portion of said first conductivity type formed within said layer and spaced from said top surface by said lightly doped portion sand said main portion said deep portion having a third doping concentration which is greater than said first doping concentration but less than said second doping concentration.

3. The device of claim 1 and further comprising a field insulating region formed in said semiconductor layer to isolate said device from other devices formed in said layer.

4. The device of claim 3 and further comprising a channel stop region formed beneath said field insulating region.

5. The device of claim 1 wherein said semiconductor layer comprises silicon and said gate electrode comprises polysilicon.

6. The device of claim 1 wherein said first and second source/drain regions comprise n-doped semiconductor and said channel region comprises p-doped semiconductor.

7. The device of claim 1 and further comprising a sidewall insulating region abutting a sidewall of said gate electrode.

8. The device of claim 1 wherein said semiconductor layer comprises a semiconductor substrate.

9. A method of forming a transistor device comprising the steps of:

providing a semiconductor layer including a top surface;

forming a first source/drain region of a first conductivity type in said semiconductor layer;

forming a second source/drain region of said first conductivity the in said semiconductor layer spaced from said first source/drain region by a channel region, said second source/drain region comprising:

a lightly doped portion of said first conductivity type adjacent said channel region and abutting said top surface, said lightly doped portion having a first doping concentration;

a main portion of said first conductivity type abutting said top surface and spaced from said channel region by said lightly doped portion said main portion having a second doping concentration which is greater than said first doping concentration;

a deep portion of said first conductivity the formed within said layer and spaced from said top surface by said lightly doped portion and said main portion said deep portion having a third doping concentration which is greater than said first doping concentration but less than said second doping concentration; and forming a gate electrode over at least a portion of said channel region and insulated therefrom.

10. The method of claim 9 wherein said first source/drain comprises: a lightly doped portion of said first conductivity type adjacent said channel region and abutting said top surface, said lightly doped portion having a first doping concentration;

a main portion of said first conductivity type abutting said top surface and spaced from said channel region by said lightly doped portion said main portion having a second doping concentration which is greater than said first doping concentration; and a deep portion of said first conductivity type formed within said layer and spaced from said top surface by said lightly doped portion sand said main portion said deep portion having a third doping concentration which is greater than said first doping concentration but less than said second doping concentration.

11. The method of claim 10 wherein said first and second source/drain regions are formed simultaneously.

12. A method of forming a transistor including a lightly doped drain comprising the steps of:

providing a semiconductor layer including a top surface;

forming a gate dielectric layer over a portion of said top surface;

forming a gate electrode over at least a portion of said gate dielectric layer, said gate electrode including first and second edges;

implanting dopants of a first conductivity type to form a first deep source/drain region in said semiconductor layer and aligned to said first edge of said gate electrode, said first deep source/drain region spaced from said top surface;

forming a first sidewall insulating region adjacent said first edge of said gate electrode and a second sidewall insulating region adjacent said second edge of said gate electrode; and forming a first main source/drain region in said semiconductor layer abutting said top surface and aligned to said first sidewall insulating region and forming a second main source/drain region in said semiconductor layer abutting said top surface and aligned to said second sidewall insulating region said first and second main source/drain regions being doped with dopants of said first conductivity type.

13. The method of claim 12 and further comprising the step of forming a mask layer over said top surface adjacent said second edge of said gate electrode prior to said step of implanting a first deep source/drain region.

14. The method of claim 13 and further comprising the steps of:

forming a-second mask layer over said top surface above said first deep source/drain region; and forming a lightly doped region in said semiconductor layer and aligned to said second edge.

15. The method of claim 14 wherein said step of forming a lightly doped region is performed prior to said step of implanting a first deep source/drain region.

16. The method of claim 12 wherein said step of implanting a first deep source/drain region further comprises implanting a second deep source/drain region in said semiconductor layer and aligned to said second edge of said gate electrode.

17. The method of claim 12 wherein said step of forming a gate dielectric comprises the step of forming an oxide layer.

18. The method of claim 12 wherein said step of forming a gate electrode comprises the step of depositing a polysilicon gate electrode.

19. The method of claim 12 wherein said dopants implanted to formed said first deep source/drain region are implanted with an implantation energy between about 100 keV and 200 keV.

20. The method of claim 12 wherein said dopants are selected from a group consisting of arsenic, phosphorus and boron.

21. The method of claim 12 and further comprising the step of forming an isolation structure adjacent said transistor to isolate said transistor from other devices formed in said semiconductor layer.

22. The method of claim 21 wherein said step of forming an isolation structure comprises forming a field oxide region.

23. The method of claim 22 and further comprising the step of forming a channel stop region beneath said field oxide region.

24. The method of claim 12 and further comprising the step of adjusting a retrograde in a doping profile by implanting second dopants after said step of implanting dopants to form a deep source/drain region, said second dopants of opposite conductivity type as said dopants.

25. The transistor of claim 1, wherein said semiconductor layer comprises a semiconductor layer of a second conductivity type opposite said first conductivity type.

26. The transistor of claim 1 wherein said deep portion is formed within said lightly doped portion, 27. The transistor of claim 26 wherein said deep portion is disposed below said main portion and abuts said main portion.

28. The method of claim 9 wherein said step of forming a second source/drain region comprises the steps of implanting said deep portion and subsequently implanting said main portion.

29. The method of claim 26 wherein said step of implanting said deep portion comprises the step of implanting dopants with an implantation energy between about 100 keV and 200 keV.

30. A method of forming a transistor device comprising the steps of:
   providing a semiconductor layer including a top surface;
   forming a deep portion of a first source/drain region within said semiconductor layer and spaced from said top surface, said deep portion being doped with dopants of a first conductivity type, and said deep portion having a first doping concentration;
   forming a lightly doped portion of said first source/drain region within said semiconductor layer and abutting a portion of said top surface and adjacent said channel region, said lightly doped portion being doped with dopants of said first conductivity type and having a second doping concentration which is less than said first doping concentration;
   forming a main portion of said first source/drain region within said semiconductor layer, said main portion abutting said top surface and adjacent said lightly doped portion, said main portion disposed above said deep portion, said main portion being doped with dopants of said first conductivity type and having a third doping concentration which is less than said first doping concentration and greater than said second doping concentration;
   forming a second source/drain region within said semiconductor layer and spaced from said lightly doped portion of said first source/drain region by a channel region, said second source/drain region being doped with dopants of said first conductivity type; and
   forming a gate electrode over at least a portion of said channel region and insulated therefrom.

31. The method of claim 30 wherein said deep portion and said lightly doped portion are formed simultaneously.

32. The method of claim 31 wherein said deep portion and said lightly doped portion are formed simultaneously by implanting dopants of said first conductivity type.

33. The method of claim 30 wherein said step of forming a second source/drain region comprises the steps of:
   forming a lightly doped portion of said second source/drain region adjacent said channel; and
   forming a main portion of said second source/drain region adjacent said lightly doped portion of said second source/drain region.

34. The method of claim 33 wherein said main portion of said first source/drain region is formed at the same time as said main portion of said second source/drain region.

35. The method of claim 33 wherein said step of forming a second source/drain region further comprises the step of forming a deep portion of said second source/drain region within said semiconductor layer and spaced from said top surface by said lightly doped portion and said main portion.

* * * * *